OSCILLATOR-MODULATOR CIRCUIT

Filed July 25, 1955

INVENTORS
CHARLES ROSEN &
CHARLES J. WEIDKNECHT
BY Edward M. Farrell
ATTORNEY

United States Patent Office 2,866,162

Patented Dec. 23, 1958

2,866,162

OSCILLATOR-MODULATOR CIRCUIT

Charles Rosen and Charles J. Weidknecht, Philadelphia, Pa., assignors to Tele-Dynamics Inc., a corporation of Pennsylvania Application July 25, 1955, Serial No. 524,239

1 Claim. (Cl. 332—23)

This invention relates to oscillators, and more particularly to oscillators which may be phase or frequency modulated.

In present-day telemetering systems, as well as other systems employing phase or frequency modulation, transmitters employing crystal controlled oscillators have been used extensively. Such transmitters provide a greatly increased stability of the carrier frequency over many of the transmitters utilizing reactance modulated variable frequency oscillators.

Very often, when a carrier wave is frequency modulated by a signal voltage, even when utilizing crystal controlled oscillators, the signal voltage feeds backs into the oscillator circuit to cause instability in the oscillator circuit. In this case, it is desirable to provide means for isolating the modulating circuit which provides the signal voltage from the oscillator circuit which provides the carrier wave for the transmitter.

In telemetering systems associated with guided missiles or other pilotless aircraft, it is important that size and weight of the telemetering equipment be kept to a minimum. Circuits or electron discharge devices performing more than a single function is, therefore, highly desirable in such telemetering systems.

It is an object of this invention to provide an improved phase shift oscillator.

It is a further object of this invention to provide an improved modulator-oscillator circuit utilizing a single electron discharge device.

It is still a further object of this invention to provide an improved highly stable and sensitive crystal oscillator which may be shifted in phase over relatively wide angles.

It is still a further object of this invention to provide an improved modulator-oscillator in which variations in an associated output circuit will not materially affect the frequency of the oscillator.

In accordance with the present invention, an oscillator circuit is associated with the screen grid, control grid and cathode of an electron discharge device. A resonant circuit tuned to a higher frequency than the oscillator frequency is provided in the anode circuit of the device to provide an inductive load. The output from the oscillator is amplified and appears at the anode to provide a variable oscillator voltage. The output from the oscillator is also applied to the anode through a capacitive element to provide a fixed oscillator voltage. A modulating signal is applied to the suppressor grid to control the amplitude of the variable oscillator voltage at the anode. The fixed and variable oscillator voltages combine vectorially in the anode circuit to provide a resultant voltage which varies in phase in accordance with the modulating signal.

Other objects and advantages of the present invention will be apparent and suggest themselves to those skilled in the art to which the invention pertains from a reading of the following specification in association with the accompanying drawing, in which.

Figures 1, 2, 3, 4, 5A, 5B, 5C:
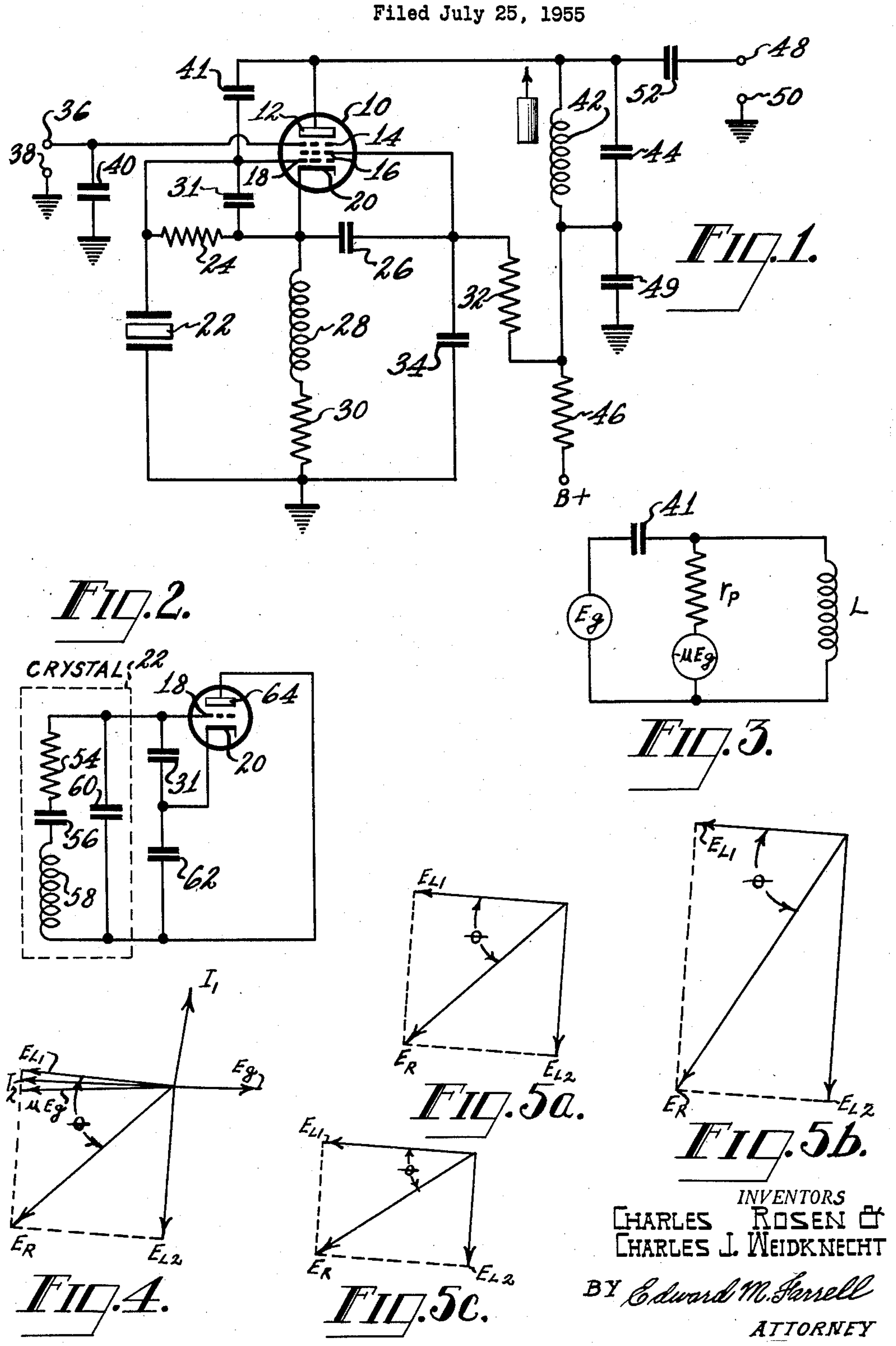
Figure 1 is a schematic circuit diagram of a modulator-oscillator circuit, in accordance with the present invention.
Figure 2 is an equivalent schematic circuit diagram of the oscillator portion of the circuit shown in Figure 1.
Figure 3 is an equivalent schematic circuit diagram of the modulator portion of the circuit shown in Figure 1, and Figures 4, 5*a*, 5*b*, and 5*c* are vector diagrams illustrating the theory of operation of the modulator-oscillator circuit shown in Figure 1.

Referring particularly to Figure 1, an oscillator-modulator circuit includes an electron discharge device or pentode vacuum tube 10 having an anode 12, a suppressor grid 14, a screen grid 16, a control grid 18 and a cathode 20. The oscillator portion of the circuit comprises a piezoelectric crystal element 22 connected between the control grid 18 and a point of reference potential, designated as ground. A biasing resistor 24 and a capacitor 31 are connected between the cathode 20 and the control grid 18. The screen grid 16, acting as an anode or plate for the oscillator portion of the circuit is connected to the cathode 20 through a capacitor 26. An inductance provided by a coil 28 is serially connected with a biasing resistor 30 between the cathode 20 and ground. The screen grid 16 is connected to a source of operating potential, designated as B+, through a resistor 32. A capacitor 34 is provided to maintain the screen grid 16 at ground potential for radio frequencies.

The modulator portion of the circuit comprises a pair of input terminals 36 and 38 adapted to be connected to a source of modulating signals. The modulating signals or voltage is applied to the suppressor grid 14 of the device 10. A capacitor 40 is provided across the terminals 36 and 38 to prevent radio frequencies from feeding back to the source of modulating signals. A capacitor 41 connects the control grid 18 to the anode 12.

The anode or output circuit for the device 10 includes a parallel resonant circuit including a variable inductance comprising a coil 42 and a capacitor 44. The anode 12 is connected to B+ through a resistor 46. A by-pass capacitor 49 is also provided in the anode circuit. The output voltage from the device 10 may be applied to a pair of output terminals 48 and 50 through a coupling capacitor 52.

It is seen that the oscillator and the phase modulator are contained within a single tube. Preferably the tube employed should be one in which the suppressor grid has a relatively high gm. The oscillator circuit has its crystal connected between the control grid and the screen grid which acts as the anode or plate of the oscillator. Since the screen grid is at ground potential for radio frequencies, due to the presence of the capacitor 34, the plate load for the oscillator which includes the coil 28 is placed in the cathode circuit and together with the capacitor 26 creates a capacitive plate load for the oscillator portion of the circuit. This capacitive plate load and the capacitor 31 appear as a tapped capacitor circuit shunting the crystal 22. The crystal 22 is designed to appear as an inductance and resonates with the total capacitance to complete the requirements for oscillations, the total capacitance being that provided by the capacitive plate load and the capacitor 31.

The modulator portion of the circuit utilizes the suppressor 14 as the modulator grid and the anode 12 as the modulator plate. The strength of the modulating signal voltage will control the amplitude of the oscillations reaching the anode through the device 10. Oscillations of a relatively fixed amplitude are also applied to the anode 12 through the capacitor 41. In effect, two sources of oscillations are applied to the anode 12, one being fixed and the other being variable and dependent upon the strength of the modulating signals. The two sources of oscillations result in two voltages which combine vectorially in the anode circuit to provide phase shift modulation. The parallel resonant circuit comprising the coil 42 and the capacitor 44 is tuned to a frequency higher than the frequency of the oscillator, thereby providing an inductive load in the anode circuit of the device 10.

Referring to Figure 2, there is shown an equivalent circuit diagram of the oscillator portion of the circuit illustrated in Figure 1. The crystal 22 is represented by a dotted box which includes a resistive element 54, a capacitive element 56 and an inductive element 58. A capacitive element 60 represents parallel plates generally associated with a crystal. The capacitive plate load which may include the coil 28 and the capacitor 26 previously shown and described in connection with Figure 1, is represented by the capacitor 62. The capacitors 62 and 31 shunt the crystal to provide a resonant circuit. The capacitors form a voltage divider with a point intermediate the two capacitors being connected to the cathode 20 to provide the necessary feedback to sustain oscillations. The plate 64 in the circuit shown is equivalent to the screen grid 16 shown in Figure 1.

Referring particularly to Figure 3, there is shown an equivalent circuit diagram of the modulator portion of the circuit illustrated in Figure 1. $Eg$ represents the oscillator voltage at the control grid 18. $r_p$ represents the plate resistance of the device 10. $-uEg$ represents the oscillator voltage amplified by the device 10. L represents the inductive load in the anode circuit of the device 10. The inductive load is attained by the resonant circuit including the coil 42 and the capacitor 44 being tuned to a frequency higher than the frequency of oscillation. In effect, it is seen that two voltages are applied across L. One of the voltages, represented by $Eg$, is applied across L through the capacitor 41. The second voltage, represented by $-uEg$, is applied across L through the device 10.

Referring to Figure 4, there is shown a vector diagram illustrating the theory of operation of the modulator-oscillator circuit of Figure 1. In the figure:

$Eg$=oscillator signal voltage.
$I_1$=oscillator signal current through the capacitor 41.
$L$=an inductive load comprising the coil 42 and the capacitor 44.
$E_{L1}$=voltage developed across L due to $I_1$.
$-uEg$=oscillator signal voltage due to the amplification of the tube 10.
$I_2$=plate current in the tube 10 due to $uEg$.
$r_p$=plate resistance of the tube 10.
$E_{L2}$=voltage developed across L due to $I_2$.
$E_R$=resultant voltage from $E_{L1}$ and $E_{L2}$.
$-\vartheta-$=phase angle between $E_{L1}$ and $E_R$.

At the oscillator frequency, the reactance of the capacitor 41 is much greater than the reactance of L. The current $I_1$ will lead $Eg$ by 90°. The voltage $uEg$ produces the plate current $I_2$, which is almost in phase with the voltage $-uEg$. The voltage $E_{L2}$ developed across L due ot the current $I_2$ will lead the current $I_2$ by 90°. The voltages $E_{L1}$ and $E_{L2}$, which are approximately 90° out of phase with each other, provide the resultant voltage $E_R$.

Referring to Figures 5*a*, 5*b* and 5*c*, as well as Figure 4, it is seen that the amplitude of the voltage $E_{L1}$ remains relatively constant, while the amplitude of the voltages $E_{L2}$ varies in accordance with the variations of the modulating signal. With variations in the modulating signal, such as may be applied to the suppresor grid 14 shown in Figure 1, $E_{L2}$ varies in amplitude. The resultant voltage $E_R$ will vary in phase, represented by the angle $-\theta-$, thereby producing phase modulation.

Figure 5*a* represents a condition in which no modulating signal is applied to the system. $E_{L1}$ and $E_{L2}$ are equal and the angle $-\theta-$ represents a central reference point. When $E_{L2}$ is increased, as illustrated in Figure 5*b*, the angle $-\theta-$ increases. When $E_{L2}$ is decreased, as illustrated in Figure 5*c*, the angle $-\theta-$ decreases.

It is noted that although the phase modulated output from the oscillator modulator circuit embodying the present invention has variations of amplitude, these variations may be eliminated in subsequent stages. For example, if frequency multipliers are used in subsequent stages, class C operation of such stages will tend to remove substantially all of these amplitude variations. Other limiting techniques, well-known to those skilled in the art, may also be employed to remove the amplitude variations from the modulator-oscillator circuit.

It is also known that various frequency multipliers following the oscillator-modulator stage will greatly increase the phase variations of the modulated output voltage. Increasing the phase variation in a transmitter output will generally result in an improved signal to noise ratio.

The modulator-oscillator circuit embodying the present invention has provided a circuit especially adapted for subminiature crystal controlled transmitters. In practice, the oscillator portion of the circuit has proven highly stable. An important factor in the stability of the oscillator is the isolation provided between the oscillator and the modulator circuits. The screen grid 16 is maintained at ground potential to provide this isolation. Slight variations in the plate load including a slight detuning of the resonant circuit including the coil 42 and the capacitor 44 do not materially affect the frequency of the oscillator circuit.

The sensitivity of the modulator-oscillator circuit is high due to the fact that the modulating signal is applied to a high gm suppressor grid 14. In the circuit wherein the modulating signal is applied to grid having a relatively high D. C. potential, the effect of the modulating signal is greatly reduced thereby reducing the sensitivity of the circuit.

The circuit shown has provided a small, compact modulator-oscillator of high reliability. Such compactness and reliability is of prime importance in telemetering systems associated with guided missiles where extra size and weight is undesirable and where slight variations in the oscillator's frequency will result in false indications of the values of various measured functions such as speed, pressure or acceleration.

What is claimed is:

A modulator-oscillator circuit comprising a pentode tube having an anode, a cathode, a control grid, a screen grid and a suppressor grid, means providing a point of reference potential, a crystal for providing an inductive element connected between said control grid, and said point of reference potential means providing a capacitive load connected in parallel relationship with said inductive element of said crystal to provide a parallel resonant circuit, feedback means from said screen grid to said control grid to sustain oscillations in said parallel resonant circuit, said oscillations being amplified by said pentode tube and appearing at said anode as a variable amplitude oscillating voltage lagging by substantially ninety degrees the voltage at said control grid, capacitive means connecting said control grid to said anode whereby said oscillations applied to said anode from said control grid through said capacitive means leads the oscillations at said control grid by substantially one hundred eighty degrees, said last-named oscillations providing a relatively fixed amplitude oscillating voltage, means for applying a modulating voltage to said suppressor grid, said modulating voltage controlling the amplitude of said variable amplitude oscillating voltage, said fixed oscillating voltage and said variable amplitude oscillating voltage combining vectorially at said anode to provide a resulting voltage the phase of which varies in accordance with said modulating voltage, and a second resonant circuit connected in the anode circuit of said pentode tube, said second resonant circuit being tuned to a frequency higher than the frequency of said oscillations to provide a variable inductive load to provide means for adjusting said modulator-oscillator circuit for optimum linearity without substantially affecting said oscillations.

References Cited in the file of this patent

UNITED STATES PATENTS

| | | |
|---|---|---|
| 1,931,530 | Dow | Oct. 24, 1933 |
| 2,438,392 | Gerber | Mar. 23, 1948 |
| 2,491,244 | Becker | Dec. 13, 1949 |
| 2,506,679 | Oswald | May 9, 1950 |

OTHER REFERENCES

Pub. I: Radio Engineering (3rd edition), Terman, McGraw-Hill Book Co., Inc., New York, pages 429 and 430.